United States Patent
Jean et al.

(10) Patent No.: US 7,612,641 B2
(45) Date of Patent: Nov. 3, 2009

(54) SIMPLIFIED SURFACE-MOUNT DEVICES AND METHODS

(75) Inventors: Henry Jean, Chula Vista, CA (US); Hamlet Abedmamoore, San Diego, CA (US); Peter J. Gutierrez, III, San Diego, CA (US); David Thanh Phan, San Diego, CA (US)

(73) Assignee: Pulse Engineering, Inc., San Diego, CA (US)

( * ) Notice: Subject to any disclaimer, the term of this patent is extended or adjusted under 35 U.S.C. 154(b) by 0 days.

(21) Appl. No.: 11/231,486

(22) Filed: Sep. 20, 2005

(65) Prior Publication Data

US 2006/0114094 A1    Jun. 1, 2006

Related U.S. Application Data

(60) Provisional application No. 60/611,915, filed on Sep. 21, 2004.

(51) Int. Cl.
*H01F 27/29*    (2006.01)
(52) U.S. Cl. ...................................... 336/192
(58) Field of Classification Search ............... 336/65, 336/83, 192, 198, 200, 232, 220–223
See application file for complete search history.

(56) References Cited

U.S. PATENT DOCUMENTS

| | | | |
|---|---|---|---|
| 3,449,704 A | 6/1969 | Mitsuo et al. | |
| 3,812,442 A | 5/1974 | Muckelroy | |
| 4,119,914 A | 10/1978 | Duncan | |
| 4,845,452 A | 7/1989 | Sasaki et al. | |
| 5,351,167 A | 9/1994 | Wai et al. | |
| 5,699,025 A | 12/1997 | Kanoh et al. | |
| 5,774,028 A * | 6/1998 | Kim ........................... 333/181 | |
| 5,802,702 A | 9/1998 | Fleming et al. | |
| 5,923,237 A | 7/1999 | Sato et al. | |
| 6,005,467 A | 12/1999 | Abramov | |
| 6,073,339 A | 6/2000 | Levin | |
| 6,087,920 A | 7/2000 | Abramov | |
| 6,087,921 A | 7/2000 | Morrison | |
| 6,127,911 A | 10/2000 | Haller et al. | |
| 6,144,280 A * | 11/2000 | Amada et al. ............... 336/192 | |
| 6,188,305 B1 | 2/2001 | Chang et al. | |
| 6,223,419 B1 | 5/2001 | Abramov | |
| 6,252,486 B1 | 6/2001 | Wolf | |

(Continued)

FOREIGN PATENT DOCUMENTS

JP    09-162072    6/1997

(Continued)

*Primary Examiner*—Tuyen T Nguyen
(74) *Attorney, Agent, or Firm*—Gazdzinski & Associates, PC

(57) ABSTRACT

A low cost, low profile, small size and high performance electronic device for use in, e.g., electronic circuits where a transformer, inductor, or mixer is required. In one exemplary embodiment, the device includes a "binocular" ferrite core comprising a plurality of core apertures and windings. The core is shaped with one or more channels which are at least partly plated (metallized) so as to allow bonding of the winding terminations directly to the core. The placement of these plated areas allows simplified surface mounting. The plated areas also obviate a termination header, thereby simplifying the manufacture of the device and reducing its cost. Methods for manufacturing the device are also disclosed.

35 Claims, 12 Drawing Sheets

U.S. PATENT DOCUMENTS

| | | |
|---|---|---|
| 6,262,649 B1 | 7/2001 | Roessler et al. |
| 6,344,784 B1 | 2/2002 | Murata et al. |
| 6,348,850 B1 | 2/2002 | Kimura et al. |
| 6,369,985 B1 | 4/2002 | Gouo et al. |
| 6,373,366 B1 | 4/2002 | Sato et al. |
| 6,378,757 B1 | 4/2002 | Holcombe et al. |
| 6,466,454 B1 | 10/2002 | Jitaru |
| 6,489,878 B2 | 12/2002 | Baarman et al. |
| 2001/0025410 A1 | 10/2001 | Paris et al. |
| 2002/0084881 A1 | 7/2002 | Kummel |
| 2002/0180574 A1 | 12/2002 | Toi et al. |

FOREIGN PATENT DOCUMENTS

| | | |
|---|---|---|
| JP | 11-186041 | 7/1999 |
| WO | WO 98/57338 | 12/1998 |
| WO | WO 99/53508 | 10/2001 |

* cited by examiner

WOUND COIL

OR

WOUND COIL

WIRES ROUTED

WIRES SOLDERED

SIMPLIFIED SURFACE-MOUNT DEVICES AND METHODS

PRIORITY AND RELATED APPLICATIONS

This application claims priority to U.S. Provisional Patent Application Ser. No. 60/611,915 filed Sep. 21, 2004 of the same title, which is incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

1. Field of the Invention

The present invention relates generally to electronic circuit elements and more particularly to inductive devices having various desirable electrical and/or mechanical properties, and methods of operating and manufacturing the same.

2. Description of the Related Art

In the highly competitive world of the contract manufacture of electronics and electronic components, price erosion is a reality every manufacturer must manage effectively to remain competitive against its competition. In order to remain competitive, one must be able to produce the desired components for less cost than competitors, without sacrificing quality or any significant performance attribute. This is especially true of electronic circuit elements and especially inductive devices.

Myriad different configurations of electronic circuit elements and inductive devices are known in the prior art. For example, U.S. Pat. No. 3,449,704 to Mitsuo, et al. and issued Jun. 10, 1969 discloses an impedance transformer having a single close-in type through hole with at least a two turn primary and a single turn secondary wound thereon. Both of the windings are maintained in close contact with the inside wall of the hole of the core, and, in regions inside the hole, are brought into close contact with each other. The respective turns of the primary winding in regions outside said hole are spaced from one another.

U.S. Pat. No. 3,812,442 to Muckelroy issued May 21, 1974 and entitled "Ceramic inductor" discloses a monolithic microminiature inductor comprising a helical conductive path of deposited metal film immersed in a rectangular block of magnetic refractory material. The inductor has metal caps at each end of the block as terminations. These terminations may be soldered to metallized pads located on a substrate. A method for making this inductor is disclosed wherein loops of conductive metal are deposited onto a thin un-sintered magnetically permeable ceramic sheet with holes for interconnection therein and wherein the holes are aligned and the sheets are laminated such that upon sintering said metal forms a helical contiguous conductive path immersed a contiguous block of ceramic.

U.S. Pat. No. 4,119,914 to Duncan issued on Oct. 10, 1978 and entitled "Double balanced mixer using single ferrite core" discloses a double balanced mixer using a single ferrite core construction. The core includes two apertures and a transformer is wound through each aperture. The two transformers are connected by diodes in the known manner to provide the mixer.

U.S. Pat. No. 4,845,452 to Sasaki, et al. issued Jul. 4, 1989 and entitled "Composite bead element" discloses a composite bead element comprising a chip-like magnetic body in a shape of a nearly rectangular parellelepiped in which a recess is provided, at least one feed-through holes formed in the body and an electronic component inserted in said recess. Bead inductors are formed by conductors provided in the feed-through holes, and said electronic component and said conductors are connected by predetermined conductors on a surface of the body.

U.S. Pat. No. 5,351,167 to Wai, et al. issued Sep. 27, 1994 entitled "Self-leaded surface mounted rod inductor" discloses an electronic component adapted for surface mounting on a PC board has an elongate bobbin made of a dielectric material. A coil of wire is wound about the winding support surface of the bobbin. The coil has a pair of lead terminations which are wrapped around a pair of T-shaped lead termination support members extending from the same side of the bobbin. When the bobbin rests on top of a PC board, the support members position the wrapped lead terminations slightly above solder pads.

U.S. Pat. No. 5,699,025 to Kanoh, et al. issued Dec. 16, 1997 and entitled "Thin film chip-type filter with an external electrode formed on an adhesion layer" discloses a chip-type circuit component comprising a chip body which is formed by bonding first and second substrates with each other. A polyimide adhesion layer is provided between the first and second substrates and a thin film circuit pattern is formed on at least one of a pair of main surfaces of the first and second substrates which are opposite each other, while an external electrode is formed on an end surface of the chip body to be electrically connected with the thin film circuit pattern.

U.S. Pat. No. 5,802,702 to Fleming, et al. issued Sep. 8, 1998 and entitled "Method of making a device including a metallized magnetic substrate" discloses a method of making a metallized magnetic substrate for devices including a magnetic component involves providing an unfired ceramic body. In one exemplary embodiment, the method further involves making one or more vias through the ceramic body, coating the via side walls with conductive material, forming an aperture through the ceramic body, such that an aperture edge intersects the via, and metallizing the unfired ceramic body such that a conductive pathway is formed that includes the conductive material in the via. Finally, the metallized unfired ceramic body is fired in conventional fashion, optionally followed by deposition of additional conductor material.

U.S. Pat. No. 5,923,237 to Sato, et al. issued Jul. 13, 1999 and entitled "Wirewound-chip balun transformer" discloses a wirewound balun transformer for planar packaging comprising a flanged core which has end flanges at both ends, at least one center flange, and two or more winding recesses, a flat core held in parallel with the flanged core, and windings coiled around the winding recesses, characterized in that one side face of the center flange is not flush with but is formed behind the plane that connects one side faces on the same side of the end flanges, each of the end flanges of the flanged core has an opposing pair of electrodes formed on both side faces, and the center flange has a single electrode formed on the opposite side face.

U.S. Pat. No. 6,005,467 to Abramov issued Dec. 21, 1999 entitled "Trimmable inductor" discloses a trimmable inductor, comprising a supporting substrate having spaced apart lead terminals, a coil defined by an electrically conductive member mounted on the substrate in a continuous path of multiple turns forming a winding about an axis and extending between the lead terminals, and an electric conductive shorting member extending and electrically connected between one or more turns and a terminal of the coil to enable selective inclusion and elimination of at least part of one of the turns of the coil.

U.S. Pat. No. 6,073,339 to Levin issued Jun. 13, 2000 and entitled "Method of making low profile pin-less planar magnetic devices" discloses a method for making a planar magnetic device. The magnetic device has generally spirally-directed planar coils supported on plural substrates. The plural substrates are stacked so as to have their respective outer peripheries connected to termination pads which are laterally spaced from the termination pads of other coils, as viewed in a direction perpendicular to the planar coils. The inner termini of at least two of the coils may be interconnected by a plated via to constitute a single winding on plural planes. An exposed portion of the termination pads resides alongside vertical edges of the magnetic device and is electrically connected to a vertical plating which form pin-less terminations of the magnetic device. The magnetic device may include a beveled portion for orientation of the device in a circuit.

U.S. Pat. No. 6,087,920 to Abramov issued Jul. 11, 2000 entitled "Monolithic inductor" discloses a monolithic inductor comprising an elongated substrate having opposite distal ends, each end having an end cap extending from the opposite ends to support the substrate in spaced relation from a PC board, the end caps being formed with non-mounting areas and a deflection area for preventing the substrate resting on the non-mounting area, a substantially steep side wall on the substrate side of the end cap at the non-mounting area, and an inclined ramp extending up to a top of the end cap on the substrate side substantially opposite the non-mounting area, an electrically conductive soldering band extending partially around each end cap, each soldering band having a gap at the non-mounting area for thereby reducing parasitic conduction in the band, and an electrically conductive layer formed on the substrate in a helical path extending between the opposite ends and in electrical contact with the conductive soldering bands at the ramps. See also U.S. Pat. No. 6,223,419.

U.S. Pat. No. 6,087,921 to Morrison issued Jul. 11, 2000 entitled "Placement insensitive monolithic inductor and method of manufacturing same" discloses a monolithic inductor comprising an elongated substrate having opposite distal ends and, each end having an end cap extending radially from the respective end to support the substrate in spaced relation from a PC board, each end cap having a plurality of intersecting planar surfaces defining corners, an electrically conductive layer forming a winding on the substrate and extending between the opposite ends to provide a winding, and an electrically conductive soldering pad extending partially around at least some of the corners of said end caps at each end of the substrate in electrical contact with the conductive layer, each soldering pad providing a terminal on each of the intersecting planar surfaces.

U.S. Pat. No. 6,127,911 to Haller, et al. issued Oct. 3, 2000 and entitled "Transformer" discloses a transformer which comprises a core, a primary winding and at least one secondary winding, which are arranged as conductors on one or more layers of a flat carrier, and a coil former with a chamber system having chambers, which accommodate the layers with the windings. At least one of the chambers is closed at least in regions, with the result that long distances for creepage paths are obtained. The chamber system can be formed from two or three plastic parts by mating. The layers with the conductor tracks are routed laterally out of the chamber system in order to make contact with terminals. Webs with metallized slots are arranged on walls of the chamber system, in order to make contact with the conductor tracks. The electrical contact afforded by the slots can be additionally supported by a solder-paste application with subsequent soldering. The lateral contacts mean that plated-through holes are avoided in the case of the carrier layers.

U.S. Pat. No. 6,188,305 to Chang, et al. issued Feb. 13, 2001 and entitled "Transformer formed in conjunction with printed circuit board" discloses a transformer comprising a printed circuit board having elongated conductors printed thereon, a ferrite core having a bottom mounted onto the printed circuit board and a flex circuit. The flex circuit comprises a dielectric sheet and elongated conductors printed on both faces of the sheet. The flex circuit is contoured around a top and sides of the core. The conductors of the flex circuit are surface bonded to respective conductors of the printed circuit board to form a series of primary windings and a series of secondary windings around the core. Provision of the upper portions of the windings by means of the flex circuit is economical because it does not require handling of discrete conductor portions.

U.S. Pat. No. 6,252,486 to Wolf issued Jun. 26, 2001 and entitled "Planar winding structure and low profile magnetic component having reduced size and improved thermal properties" discloses a low profile magnetic component such as an inductor or transformer including a core and a planar magnetic winding body having a dense, rigid structure composed of a stack of individual winding patterns separated by insulating layers, and a binder/filler material. The input and output termini of the individual winding patterns are revealed in a side face of the winding body, where they are interconnected with a plated metallization. Such structures may be mounted onto a PC board, and are useful, for example, in electronic ballasts for the lighting industry.

U.S. Pat. No. 6,262,649 to Roessler, et al. issued Jul. 17, 2001 and entitled "Power magnetic device employing a leadless connection to a printed circuit board and method of manufacture thereof" discloses a surface-mountable magnetic device comprising: (1) a multi-layer circuit containing a plurality of windings disposed in layers thereof, the multi-layer circuit having first and second lateral recesses associated therewith, the first and second lateral recesses intersecting the layers of the multi-layer circuit, (2) a conductive substance disposed within the first and second lateral recesses and electrically coupling selected ones of the plurality of windings and (3) a magnetic core mounted proximate the plurality of windings, the magnetic core adapted to impart a desired magnetic property to the plurality of windings, the device locatable proximate a substantially planar substrate to allow the first and second lateral recesses to act as conductors between the plurality of windings and electrical conductors on the substantially planar substrate, the plurality of windings and the magnetic core substantially free of a surrounding molding material to allow the magnetic device to assume a smaller overall device volume.

U.S. Pat. No. 6,344,784 to Murata, et al. issued Feb. 5, 2002 and entitled "Coil component" discloses a coil component which includes a conductor film provided on the surface of a core having flanges. On one flange, first and second dividing grooves and a connecting groove are provided, whereby first and second terminals are defined. On the other flange, third and fifth dividing grooves and a connecting groove are provided, whereby third and fourth terminals are defined. First and second winding-around grooves are connected to the respective dividing grooves and arranged substantially parallel to each other. A coil connected to the first and third terminals and a coil connected to the second and fourth terminals are also provided.

U.S. Pat. No. 6,348,850 to Kimura, et al. issued Feb. 19, 2002 and entitled "Common mode choke coil" discloses a common mode choke coil adapted for surface mount applications minimized in overall size (particularly in height), with an improved bonding coefficient. This common mode choke coil has a structure comprising a ferrite core consisting of a winding core and two square planar flanges with recesses formed therein, the square planar flanges being formed integrally on each end of a winding core thereof, a pair of external electrodes disposed on the square planar flanges, a plurality of windings wound about the winding core of the ferrite core and connected by thermal bonding to the external electrodes at the recesses provided in the left and right sides of each flange, and a ferrite plate adhesively bonded to the outermost surface of the windings to join the two flanges at both ends of the ferrite core, without an adhesive bonding to the flanges themselves. As a result, a closed magnetic circuit structure of a cubic component having a high rate of bonding coefficient is obtained.

U.S. Pat. No. 6,369,985 to Gouo, et al. issued Apr. 9, 2002 and entitled "Head suspension, head assembly, and disk apparatus having a head IC mounted on a head suspension, and method for fitting a head IC to a head suspension" discloses a head slider and head IC mounted on a head suspension, the head IC being mounted on a head IC mounting surface. One or more through holes are provided on the head IC mounting surface of the head suspension and the head IC is mounted by injecting a bonding agent between the mounting surface and the head IC through the through holes. The bonding agent is evenly distributed beneath the head IC, so that the head suspension is balanced.

U.S. Pat. No. 6,373,366 to Sato, et al. issued Apr. 16, 2002 and entitled "Common mode filter" discloses a common mode filter which includes a drum-shaped core with a winding and a plate-like core fixed to flanges to form a closed magnetic path. Concave portions are formed in at least one of facing potions of both cores to provide gaps between the flanges of the drum-shaped core and the plate-like core. A plurality of electrodes each of which is successive over a upper surface, end face and lower surface of each flange are provided at portions corresponding to the gaps in each flange. A plurality of windings are wound around the winding core so that both ends of each of the plurality of windings are electrically connected and secured to the portions of the electrodes on the upper surface of each of the flanges, respectively, by conductive fixing agent. The drum-shaped core and the plate-like core are fixed to each other by an adhesive.

U.S. Pat. No. 6,378,757 to Holcombe, et al. issued Apr. 30, 2002 and entitled "Method for edge mounting flex media to a rigid PC board" discloses an edge mounting flexible media to a rigid PC board construction that can be achieved by various methods. In any method used, there is a desire to create solderable pads on the edge of the rigid PC board. In accordance with the invention, the solderable pads are created by edge plating the PC Board or by a sliced via method. For terminating flexible circuit media, the flex pads are laid out in such a way that the pads are etched in a configuration that matches up with the edge pads on the rigid PC Board. Solder past is then applied to the pads on the flex. The rigid PC Board is fixtured at a right angle to the flex and run through the reflow oven.

U.S. Pat. No. 6,466,454 to Jitaru issued Oct. 15, 2002 and entitled "Component transformer" discloses a packaging technology which induces high frequency current loops that generate electromagnetic fields which are radiated or induce high frequency current in the rest of the circuit. To reduce the radiated field, these loops have been minimized by locating the high frequency switching components close to each other and very close to the magnetic elements. By separating the high frequency switching electronic components from the rest of the electronic components and locating them on the same multilayer PCB where the magnetic element is constructed, desired results are obtained.

U.S. Pat. No. 6,489,878 to Baarman, et al. issued Dec. 3, 2002 and entitled "Method of manufacturing a magnetic power component and a magnetic power component" discloses a method of manufacturing a magnetic power component and to a magnetic power component. The component comprises a multi-layer coil which consists of several windings disposed in the layers, first and second electrical conductors which are electrically connected to the selected windings, and a first and a second core part which are arranged to direct magnetism to the windings. The first side of the multi-layer coil is provided with a cavity and the first core part is at least partially mounted in the cavity.

U.S. Patent Publication No. 20010025410 to Paris, et al. published Oct. 4, 2001 and entitled "Methods for making gapped closed-shape inductors" discloses a method which may include joining together a bottom layer, a top layer and at least one intermediate layer there between, with the bottom and top layers including a non-magnetic material, and the at least one intermediate layer including a non-magnetic material. The method may also include dividing the joined together layers into a plurality of closed-shape cores each having at least one magnetic flux gap therein provided by the non-magnetic material. The closed-shape cores may be toroidal, for example. The method may also include winding at least one conductor on each closed-shape core to form the inductors. In some embodiments the joined together layers may be divided into a plurality of strips. The method may also include punching each strip to form a plurality of closed shape cores, with toroidal core having at least one magnetic flux gap therein provided by the non-magnetic material.

U.S. Patent Publication No. 20020084881 to Kummel published Jul. 4, 2002 and entitled "Inductive component and manufacturing process for such a component" discloses an inductive component intended to be installed on a printed circuit includes at least one winding, a body, and a magnetic core. The winding is made of an electrically conductive wire wound to form a flat coil the ends of which are connected to the inner ends of connecting terminals. The body is formed from a block of insulating material over-molded onto the coil and onto the inner ends of the terminals, the body including a central opening which passes through the body along the axis of the coil. Preferably, the body is made of either a thermosetting epoxy resin or a thermoplastic polymer. The magnetic core is made of a ferrite layer that surrounds the body in a center plane containing the axis of the coil. A center element passes through the opening in the body.

U.S. Patent Publication No. 20020180574 to Toi, et al. published Dec. 5, 2002 and entitled "Coil device and method for manufacturing the same" discloses a coil device including terminal electrodes, each including a bottom-surface electrode provided on a bottom surface of a flange, side-surface electrodes provided on side surfaces of the flange, and an end-surface electrode provided on an end surface of the flange at the lower part of the end surface. The end-surface electrode is arranged on the end surface of the flange so that the upper edge of the end-surface electrode is disposed at a first level that is substantially the same as that of the upper edges of the side-surface electrodes in the vicinity of boundaries between the end surface and each side surface of the flange and is disposed at a second level lower than the first level at an approximate central portion of the end surface of the flange.

WIPO Publication No. WO-99/53508 to Labatzke published Oct. 21, 2001 discloses a ceramic support for electronic components which presents at least two contact surfaces which are electrically insulated in relation to each other. The contact surfaces are arranged on a common plane of the support. The invention is characterized in that other metallized surfaces are positioned on at least one plane of the support which is not parallel to the common plane of the contact surfaces. Each metallized surface is connected in a conductive manner to one of the contact surfaces. The invention also relates to the use of the support for inductive components and to a method for producing such a component.

Despite the foregoing broad variety of prior art inductor configurations, there is a distinct lack of a simplified and low-cost, high performance inductor configuration that lowers cost for both the component and contract manufacturer, while providing electrical characteristics and performance similar to those of more expensive devices. Specifically, prior art devices typically address two issues: (1) maintaining a desired level of electrical performance; and (2) providing a mechanical platform that assists in the manufacture of the product in an efficient and low-cost manner. Under such prior art approaches, these two needs are often addressed separately, utilizing distinct components and/or materials to address these two independent needs. As can be appreciated, this use of distinct or different components and/or materials is less than optimal from a cost and manufacturing/labor standpoint.

Hence, there is a need for an improved inductive device that offers a high degree of electrical performance, and which addresses both electrical and mechanical considerations at the same time by way of its design, therefore substantially reducing the device materials and manufacturing costs. Such improved device would ideally utilize a minimum number of discrete components (so as to reduce material costs and other overhead related charges), have minimized external dimensions (so as to allow for higher board level and packaging density), while at the same time allowing for simplification of the overall construction process (thereby reducing the labor costs associated with assembly). It would also allow the customer or user of such devices to more efficiently store (inventory) and dispense the devices during manufacturing.

SUMMARY OF THE INVENTION

The present invention satisfies the foregoing needs by providing an improved inductive device and associated methods.

In a first aspect of the invention, a simplified surface-mount electronic device is disclosed. In one embodiment, the device comprises a core element having: a plurality of apertures formed therein; a plurality of channels formed therein; a plurality of plated areas disposed at least proximate to the channels; and a plurality of windings disposed at least partly within the apertures and terminated to respective ones of the plated areas. In one variant, the plurality of apertures comprises two apertures, and the respective ones of the plated areas form at least a portion of the electrical pathway from the windings and an external device to which the electronic device is to be mounted. In another variant, the plurality of windings and the ferrite material are adapted to operate at frequencies in the range from about 5 MHz to about 1 GHz. In yet another variant, the plurality of channels are disposed in a substantially parallel orientation along at least a bottom face of the core element, and the plurality of apertures are disposed in a substantially parallel orientation within the core element, the channels and apertures also being substantially parallel to one another.

In a second aspect of the invention, a method for manufacturing a miniaturized electronic device is disclosed. In one embodiment, the method comprises: providing a core element, the core element having a plurality of apertures and a plurality of channels formed therein; plating at least portions of the core element, the plating being deposited proximate to at least a portion of the plurality of channels and resulting in a plurality of plated surfaces; providing at least one conductive winding; disposing the at least one winding around at least portions of the core element and through at least one of the plurality of apertures; and routing portions of the at least one winding to be at least proximate to the plated surfaces; and bonding the portions of the at least one winding to be in electrical communication with respective ones of the plated surfaces.

In a third aspect of the invention, a surface-mount radio frequency transformer is disclosed. In one embodiment, the transformer comprises: a binocular core having a plurality of channels formed therein, wherein at least one of the plurality of channels has a plurality of plated surfaces; and at least two windings, each of the at least two windings having at least two free ends associated therewith, each of the at least two free ends being bonded to one or more of the plated surfaces.

In a fourth aspect of the invention, a standards-compliant electronic device carrier assembly is disclosed. In one embodiment, the assembly comprises: a plastic carrier tape having a plurality of recesses therein; a plurality of surface-mount electronic devices adapted to fit inside the plurality of pockets, the plurality of surface-mount electronic devices, comprising: a core element having a plurality of apertures formed therein, a plurality of channels formed therein, a plurality of plated areas disposed at least proximate to the channels, and a plurality of windings disposed at least partly within the apertures and terminated to respective ones of the plated areas. In one variant, the plastic carrier has a width of approximately 12 mm and a pitch of approximately 8 mm. The carrier assembly further comprises a 13-inch reel and adapted to carry 3000 such devices, and is compliant with ANSI/EIA Standard 481.

In a fifth aspect of the invention, a reduced-profile surface mount electronic device is disclosed. In one embodiment, the device comprises: a core element having: a plurality of apertures formed substantially on a bottom surface of the core element; a plurality of apertures formed in the core element; a plurality of plated areas disposed at least proximate to the channels; and a plurality of windings disposed at least partly within the apertures and terminated to respective ones of the plated areas. The channels and plated areas cooperate to provide a termination base for terminating the device to a substrate without use of any termination header. In one variant, contact pads of the substrate are received at least partly within the channels so as to reduce the vertical profile of the device when mounted on the substrate.

BRIEF DESCRIPTION OF THE DRAWINGS

The features, objectives, and advantages of the invention will become more apparent from the detailed description set forth below when taken in conjunction with the drawings, wherein.

DETAILED DESCRIPTION OF THE INVENTION

Reference is now made to the drawings wherein like numerals refer to like parts throughout.

As used herein, the term "magnetically permeable" refers to any number of materials commonly used for forming inductive cores or similar components, including without limitation various formulations made from ferrite or ferrous compounds.

As used herein, the term "winding" refers to any type of conductor, irrespective of shape, cross-section, construction or number of turns, which is adapted to carry electrical current. A winding may comprise for example, without limitation, a single strand of conductive material, multiple strands of such material (whether intertwined, separate, or otherwise), or a bifilar winding.

Overview

The present invention provides, inter alia, improved "binocular core" inductive apparatus and methods for manufacturing and utilizing the same.

Typical prior art binocular cores utilize a ferrite or similar binocular core bonded to a header or other termination structure (see discussion of FIG. 2 below). This termination arrangement not only increases the manufacturing cost (including labor and additional component costs) of the device, but further causes the device profile and footprint to be larger than it has to be. Increasingly space- and performance-conscious applications demand a smaller profile in conjunction with high electrical performance and low cost. The ability to use such devices with a conventional automated "pick and place" or other production machine is also highly desirable.

The present invention is adapted to overcome these disabilities of the prior art by providing a simplified and low-cost core configuration which eliminates the need for a separate termination header or element. Advantageously, the basic core "blank" can be configured in any number of different ways to adapt to different types of uses (e.g., inductor, transformer, mixer, etc.) and surface mount applications. The geometry of the core can also be varied as required to achieve a particular point within the performance/cost/size design space. The device is also advantageously adapted for ready use by a pick-and-place, tape-reel, and other similar automated manufacturing devices.

Exemplary Embodiments

Figure 1:
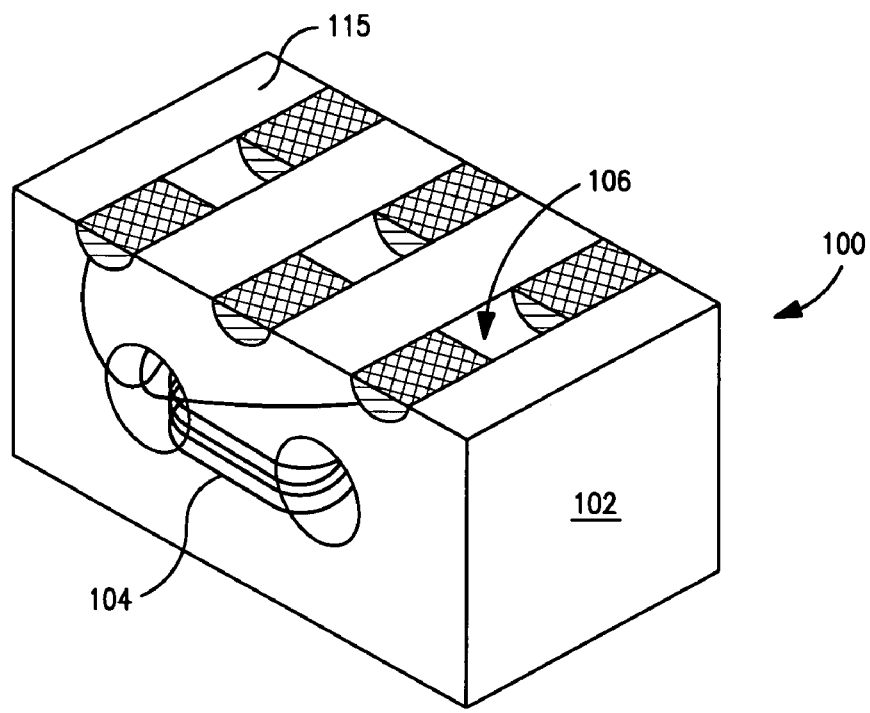
FIG. 1 is a bottom perspective view of one exemplary embodiment of the improved device of the present invention.
Figure 1B:
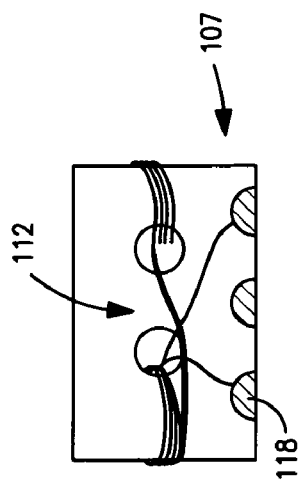
FIG. 1b is a side elevational view of the core of the device of FIG. 1.
Figure 1G:
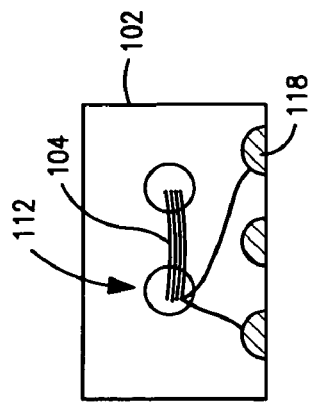
FIG. 1g is a side elevational view of the device of FIG. 1 yet with an alternate winding configuration.
Figure 1A:
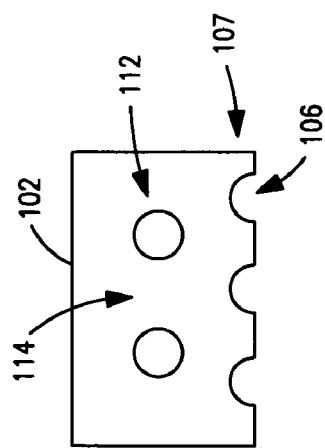
FIG. 1a is a top elevational view of the core of the device of FIG. 1.
Figure 1F:
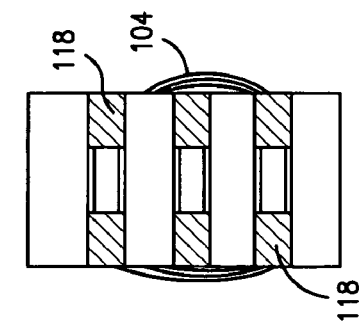
FIG. 1f is a side elevational view of the device of FIG. 1.
Figure 1E:
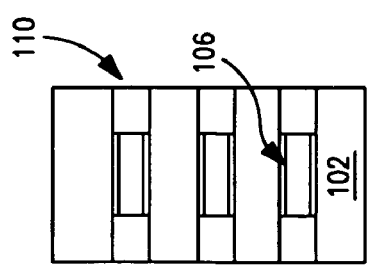
FIG. 1e is a bottom elevational view of the core of the device of FIG. 1, shown with the termination channels plated, and the windings installed and terminated.

Referring now to FIGS. 1-1g, a first exemplary embodiment of the present invention is described in detail. It will be recognized that while the following discussion is cast in terms of a "binocular" core having two core apertures, the invention may be applied to other types of cores including those with three (trinocular) or more apertures.

Furthermore, it will be appreciated that the various aspects of the invention can be applied to any number of different devices including without limitation inductors, inductive reactors ("choke coils"), transformers (including impedance transformers such as described in U.S. Pat. No. 3,449,704 issued Jun. 10, 1969 and incorporated herein by reference in its entirety), and signal mixers (see, e.g., U.S. Pat. No. 4,119,914 issued Oct. 10, 1978 also incorporated herein by reference in its entirety). Any number of different applications and configurations of the invention are therefore possible.

Referring now to FIGS. 1-1g, a first embodiment of the device 100 is described. As shown, the device 100 comprises a core element 102 (here, a unitary ferrite or similar configuration, although other configurations and/or materials may be used if desired), and a plurality of windings 104. Apertures 112 are also formed in the core with their axis being disposed substantially parallel to the plane of the base 107 of the core, although this is not a requirement. The windings 104 may be routed in any number of different configurations through the apertures 112 and around the outer periphery of the core 102, such as is shown in FIGS. 1 and 1g.

The core element 102 further includes a plurality of channels 106 formed in the base 107 thereof (the device 100 is inverted from a typical normal orientation in FIG. 1). Each of the channels contains one or more metallized or plated regions 110 adapted for termination as described below. The free ends of the windings 104 are terminated to respective ones of the plated areas 110, such as via a eutectic solder, conductive adhesive, welding, brazing, or other comparable means. Eutectic solder is typically preferred for its low cost and ease of handling. The various winding and termination patters necessary to effectuate a given device (e.g., transformer) are well known to those of ordinary skill, and accordingly not described further herein.

The channels 106 may be of literally any cross-sectional shape (and even non-uniform as a function of their width or length) as desired. In the illustrated embodiment, the channels 106 are substantially semi-circular in cross-section and uniform along their length, and hence semi-cylindrical. This shape is chosen since it has been found by the Assignee hereof to provide an optimal environment for applying the plating (metallization) layer to the channel surfaces in terms of adhesion and uniformity of the thickness of the plating layer. Other shapes may be used as well (as described elsewhere herein).

The depth of the aforementioned "semi-cylinder" within the core can be varied as desired as well, such that the interior (plating) surface of the channel 106 covers a varying arc ranging anywhere from a few degrees to greater than 180 degrees ($\pi$ radians) if desired. The illustrated embodiment utilizes an arc of approximately 180 degrees.

Figure 1D:
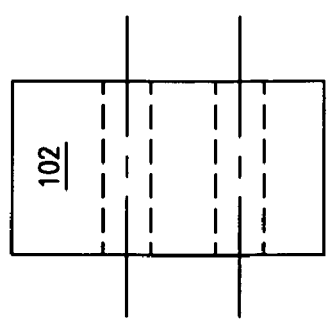
FIG. 1d is a bottom elevational view of the core of the device of FIG. 1, shown with the termination channels plated.
Figure 1C:
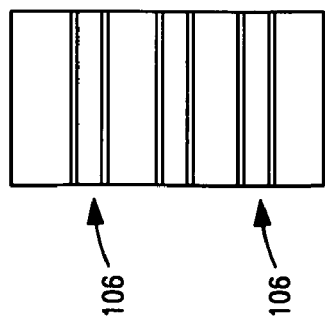
FIG. 1c is a bottom elevational view of the core of the device of FIG. 1, shown with the termination channels unplated.

Similarly, the arc subtended by the plated regions 110 can vary over the same range, and need not be coincident with the channel arc (i.e., the arc subtended by the plating can be a value different than that of the channel). The thickness of the plating may also be varied as desired in order to optimize the performance (and cost) of the device 100. Specifically, the thickness can be varied in a uniform fashion (i.e., the plating thickness is substantially constant over the entire arc), or alternatively the thickness can vary as a function of arc. Furthermore, the thickness or geometry of the plating can vary as a function of longitudinal position in the channel(s); a discrete or stepped form of this variation is shown, e.g., in FIG. 1*d*, although more gradual variations may also be utilized.

As shown in FIG. 1, et seq, the exemplary device 100 utilizes plating material such as silver and tin over-plating based on existing plating processes 118 to form the electrical (and mechanical) joint between the plated areas 110 and the winding terminus portions. This solder is brought up to the level of the bottom plane 115 of the device core 102, so as to provide a substantially uniform planar surface on the bottom of the device 100. However, as discussed below with respect to FIG. 7*b*, the level of the solder can range anything from very concave or conformal with the interior surface of the channel 106, to even being convex or otherwise outwardly projecting (e.g., balls, apex-shaped, etc.) from the base plane 115 of the device.

In one embodiment of the invention, the plating process comprises a Silver/Nickel/Tin process. Specifically, the Silver is plated first, followed by the Nickel, and then the Tin. Silver thickness is on the order of 6 microns (6E-06 m), while the Nickel and Tin layers are about 4 microns (4E-06 m) in thickness. It will be appreciated that other thicknesses and materials may be used as well, the aforementioned configuration being exemplary. As will be appreciated by those of ordinary skill, modern trends (such as the so-called "ROHS" directive), are to move away from leaded (Pb-based) components. Notwithstanding, it will be appreciated that other thicknesses and materials may be used as well (such as e.g., leaded solder. The Silver may be spray coated if desired, while the other materials are electroplated using conventional electroplating techniques known to those of ordinary skill, although the method of application can also vary for each constituent material as desired.

In another embodiment, the eutectic itself can take the place of the plating where sufficient mechanical and electrical properties can be achieved (i.e., the eutectic will bond properly to the core element material, and sufficient electrical conductivity through the eutectic is provided).

Figure 2A:
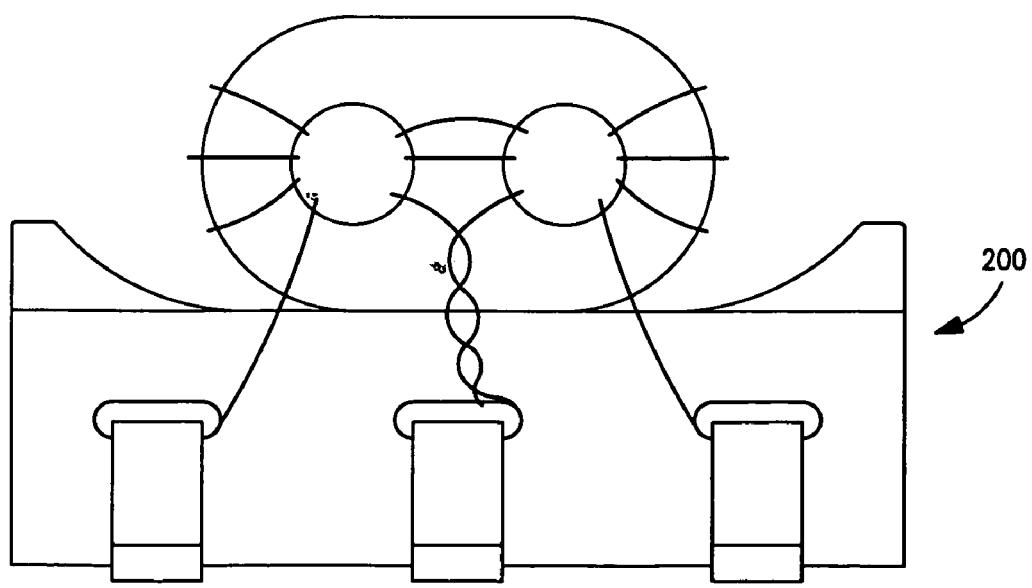
FIG. 2a is a side elevational view of a typical prior art binocular core arrangement.

The foregoing termination scheme has several distinct advantages, including (i) lower cost due to obviating the cost and labor associated with a separate termination header assembly 200 such as that of FIG. 2; (ii) lower vertical profile, since essentially "wasted" space in the bottom region 107 of the core 102 is utilized for termination; and (iii) smaller footprint (area of PCB or parent device consumed) due to the lack of the termination header and any associated terminals; the contact terminals are all "tucked under" the core 102 as shown in FIG. 1.

The exemplary core 102 is in the illustrated embodiment formed directly as shown (e.g., in a mold or form of the type well known in the art), or alternatively machined from a block to have the desired features and number of apertures 112, e.g., either two, three, four, etc. Hence, using the latter approach, a common block can be used as the basis for multiple different designs, and no special (expensive) additional tooling is required. For example, where a device is destined to have two apertures 112, a core 102 that can accommodate up to say four apertures 112 can be used, with the additional portion of the core "blank" simply machined off before assembly. The height, cross-sectional area, and profile of the core 102 can be adjusted as desired (discussed in greater detail below) in order to provide the desired electrical properties; hence, the rectangular shape shown is merely illustrative.

It will be appreciated that the core of the present invention can feasibly be made to have any number of apertures including even and odd numbers, and may be hybridized in any number of facets including combined use of varying dimension or profile apertures 112, varying channels 106, use of varying thickness windings 104, non-symmetric geometries, etc.

Figure 3:
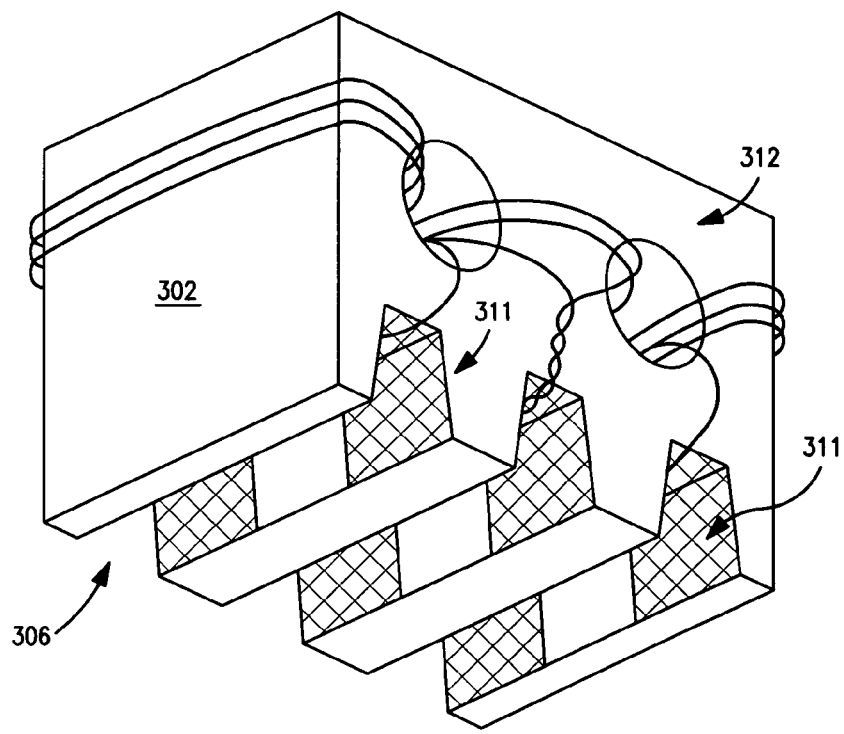
FIG. 3 is a bottom perspective view of a second exemplary embodiment of the improved device of the present invention, shown assembled.
Figure 3A:
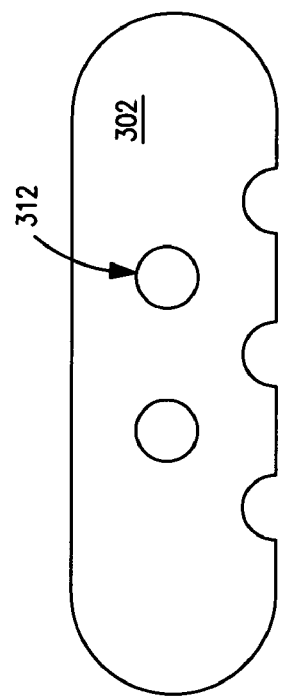
FIGS. 3a-3d are side elevational views of various alternate embodiments of the device core according to the present invention.
Figure 3B:
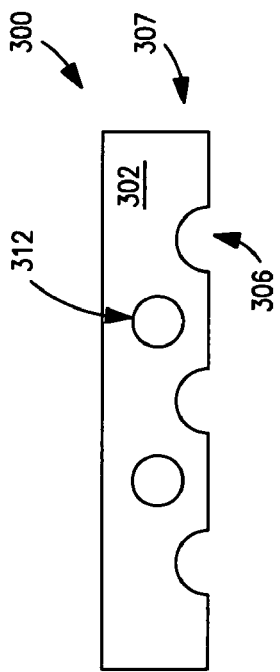
Figure 3C:
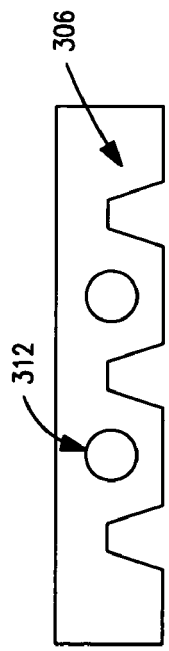
Figure 3D:
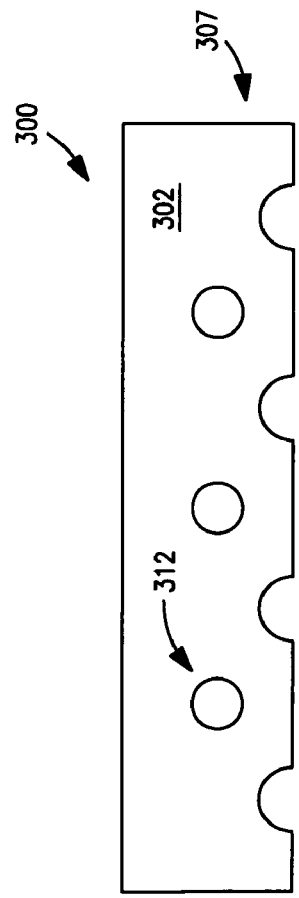

Additionally, the size and geometry of the core element 102 can be varied depending on the desired electrical and magnetic properties. For example, where all magnetic currents within the core are additive in the center element 114, a larger cross-section element may be used. Alternatively, where the currents are destructive or "buck", a smaller element may be used. Also, the apertures 112 can have a cross-sectional shape other than circular (and may also even have a simple or complex taper profile), such as for example elliptical, hexagonal, rectangular, triangular, etc., and may be sized differently. The outer edges of the core may also be rounded if desired, such as shown in the variant of FIG. 3*d*.

Figure 5:
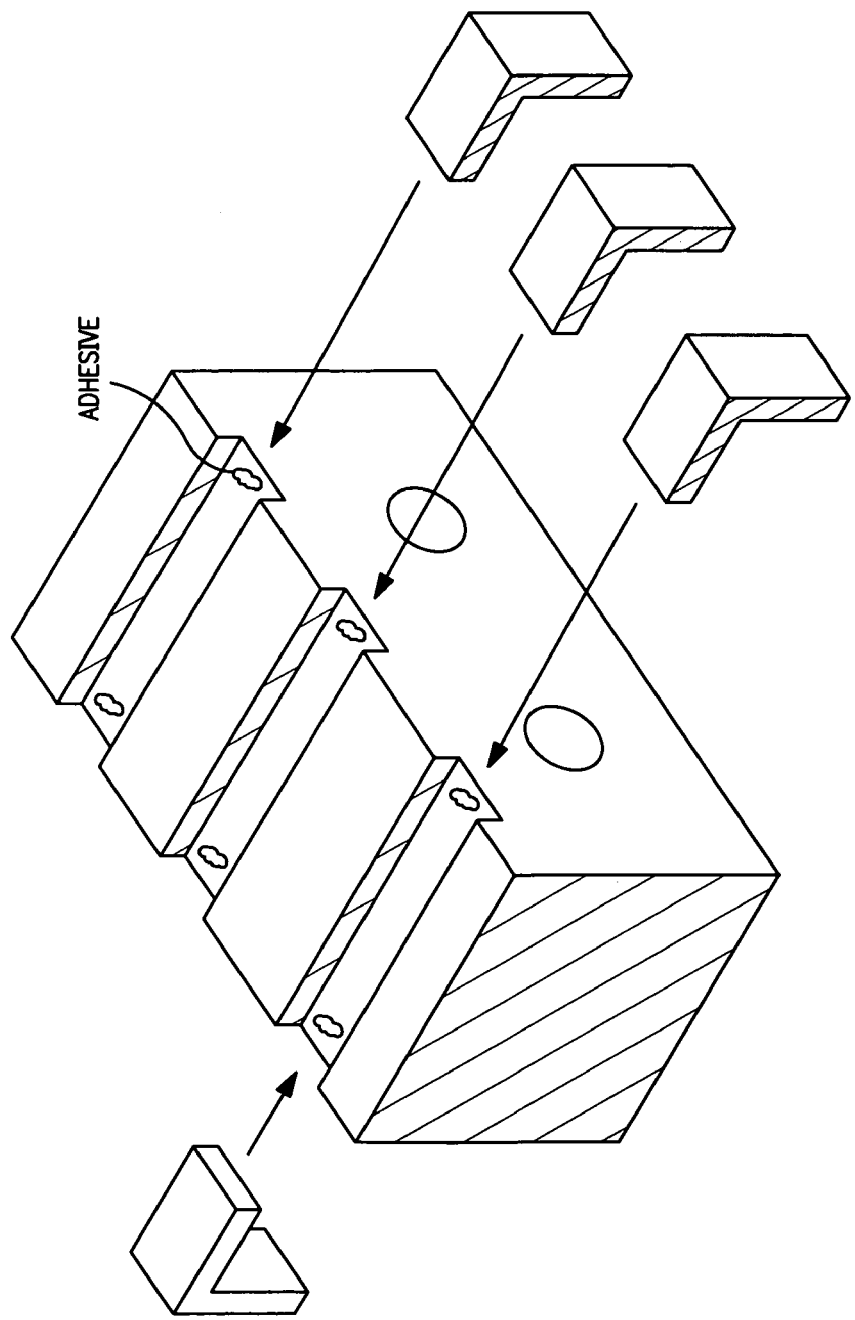
FIG. 5 is a bottom elevational view of yet another embodiment of the device, shown configured for L-shaped termination pads.

The windings 104 are, in the illustrated embodiment, magnet wire of the type well known in the electronic arts, although other types of conductors can be used with proper adaptation. For example, thin alloy or copper-based conductive strips of a predetermined length and thickness can be deformed in order to fit within respective channels 106 formed in the core 102 (see, e.g., FIG. 5 herein). The material, width, thickness, and other properties of the windings are selected so as to provide a minimum of electrical resistance and hence heating, although other performance attributes may be considered in their design. Furthermore, it will be appreciated that when two or more windings are used, the windings 104 may be made heterogeneous in, e.g., inductance, thickness/size (e.g., AWG), material, etc. Myriad different variations of these different parameters are possible in order to produce a device with the desired qualities.

Other possible materials include without limitation silver, gold or palladium or alloys thereof; however, these materials add significant cost to the device.

The device 100 may also be externally shielded if desired using any one of myriad well-known shielding technologies available in the art (such as tin plating or use of a wrap-around Faraday shield).

The device 100 of FIG. 1 (as well as others described herein) advantageously can provide excellent electrical performance comparable to that of the larger and more costly prior art devices (e.g., up to frequencies of 2.5 GHz in the illustrated embodiment). Hence, the elimination of the termination header, reshaping of the core and addition of the metallized areas has no adverse effects on electrical or magnetic performance.

It will also be appreciated that the more spatially compact arrangement of the present invention also provides benefits in terms of reduced wire run length, thereby reducing both cost and radiated electromagnetic noise. The reduced wire run lengths also translate to enhanced electrical performance in certain applications such as reduction in transmission line losses and control of coupling of adjacent conductors.

In an alternate embodiment of the device (FIG. 3), the channels 306 formed within the core 302 comprise tapered (or alternatively straight-cut) angular channels with substantially planar interior surfaces 311.

In another variant of the device (FIGS. 3a-3d), the core 302 can be made to have a very low vertical profile by increasing the spacing between the channels 306 and accordingly lowering the apertures 312 relative to the base 307 of the device 300 (i.e., into the expanded region created by increasing the channel spacing).

Figure 4:
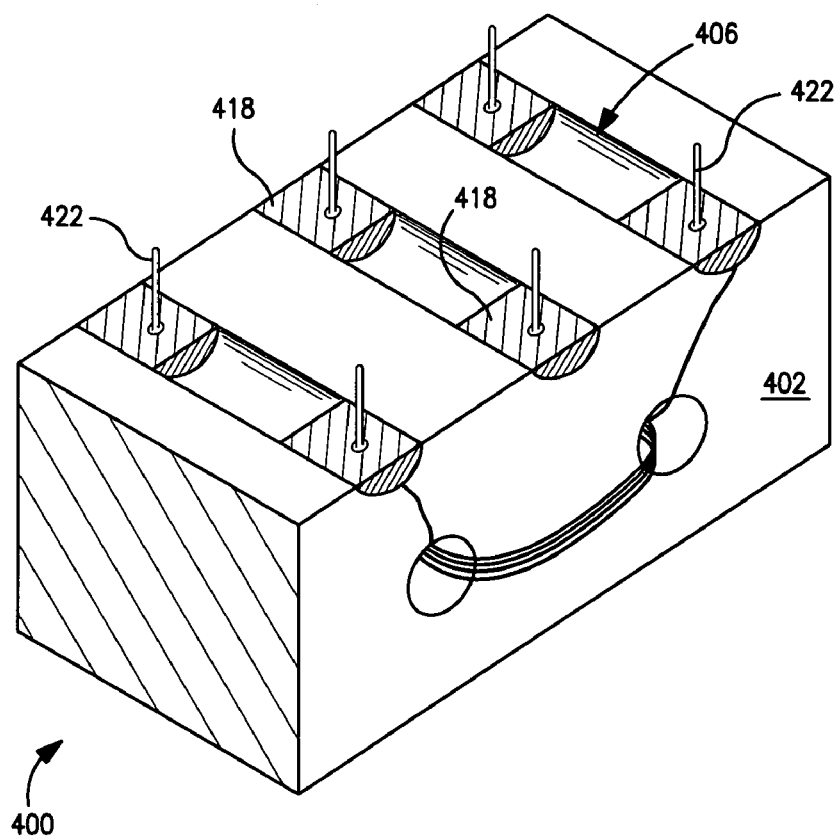
FIG. 4 is a bottom elevational view of another embodiment of the device, shown configured for a pin termination scheme.

FIG. 4 illustrates another embodiment of the device 400 wherein a plurality of pin-type terminals 422 are used. In this embodiment, the terminals 422 are embedded within the solder or other termination material 418 formed within the channels 406 of the core 402. For example, at time of soldering, the terminals 422 can be held in position using an external machine (or breakaway or disposable leadframe) until set within the solder. Other approaches may be used. Also, the terminals 422 need not necessarily comprise pins, but rather can comprise other shapes such as balls, cylinders, L-shaped leads, "gull-wing" DIP terminals, etc.

Figure 6:
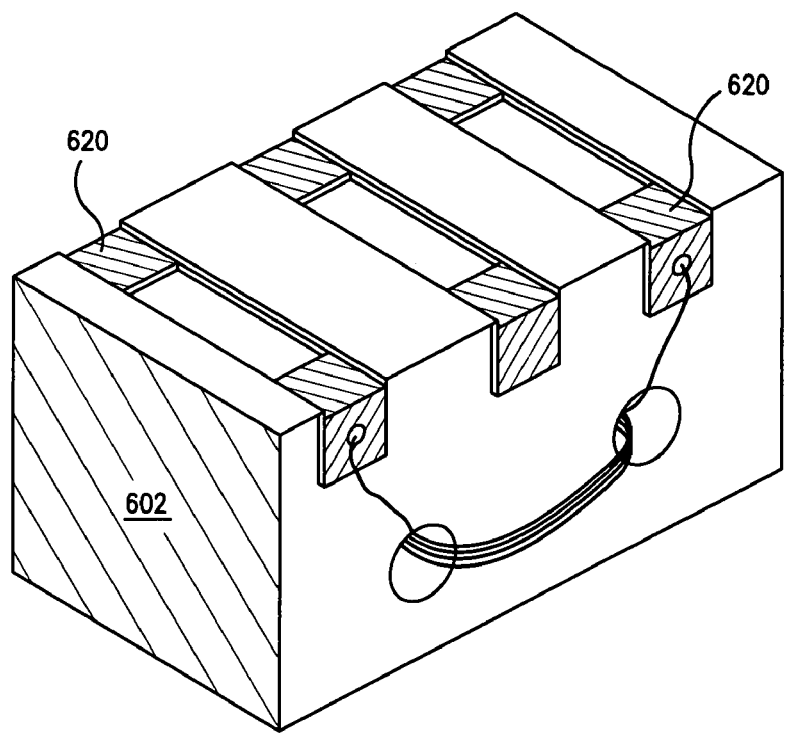
FIG. 6 is a bottom elevational view of still another embodiment of the device, shown configured for plated L-shaped areas.

FIG. 6 is a bottom elevational view of still another embodiment of the device, shown configured for plated L-shaped areas. L-shaped metallized "pads" 620 are coated or plated onto the surface of the core 602, such as within shallow channels 606 formed within the core. The conductive terminations 620 can also feasibly be sprayed on as well, i.e., as a thin layer of conductive material on the surface of the core element 602.

Myriad other approaches to providing conductive traces on one or more surfaces of the core may be used consistent with the invention, all such variants being readily implemented by those of ordinary skill provided the present disclosure.

As described above, the device 100 is largely self-leaded. In this context, the term "self-leaded" refers to the fact that separate terminals electrically connecting the windings 104 to corresponding pads on the PCB or parent device, are not needed. One advantage of having self-leaded windings is to minimize the component count and complexity of the device 100, as well as increasing its reliability and spatial compactness/footprint.

When the assembled device 100 is disposed on the parent device (e.g., PCB), the contact portions of the terminations are situated proximate to the PCB contacts pads, thereby facilitating direct bonding thereto (such as via a solder process). This feature obviates not only structures within the device 100, but also additional steps during placement on the PCB.

Method of Manufacture

Figure 7:
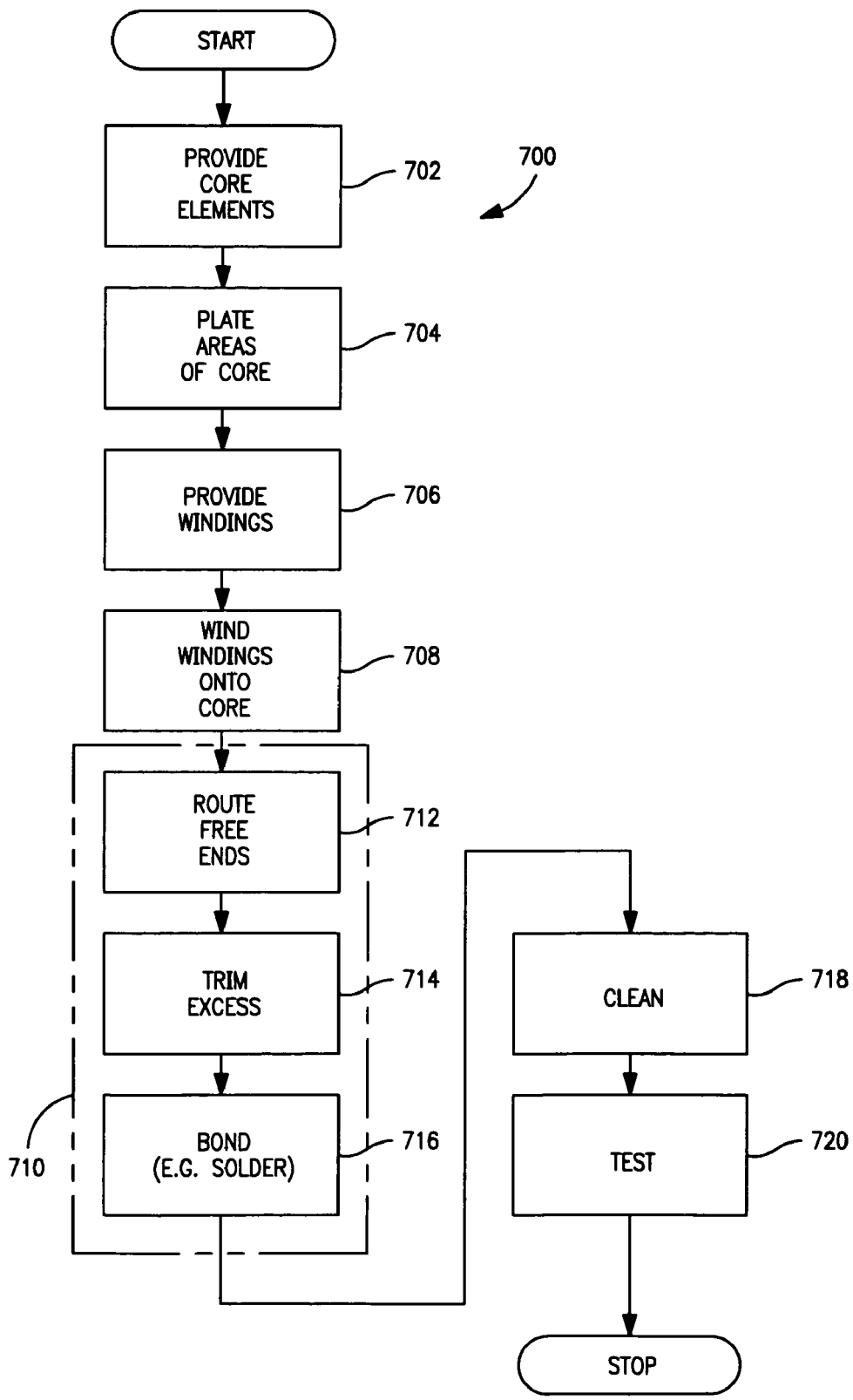
FIG. 7 is a logical flow diagram of an exemplary embodiment of the method of manufacturing the device(s) of the invention.
Figure 7A:
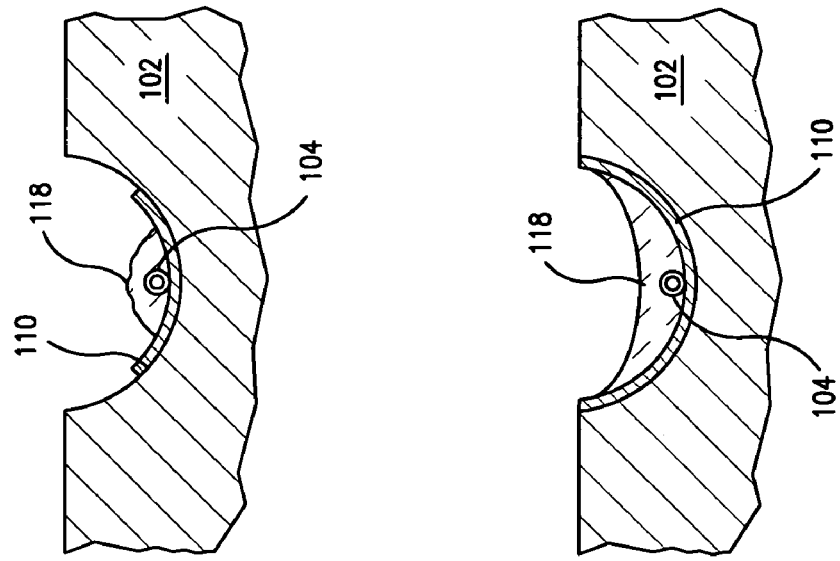
FIG. 7a is a composite illustration showing various options for solder joint configuration the exemplary device of FIG. 1.
Figure 7A:
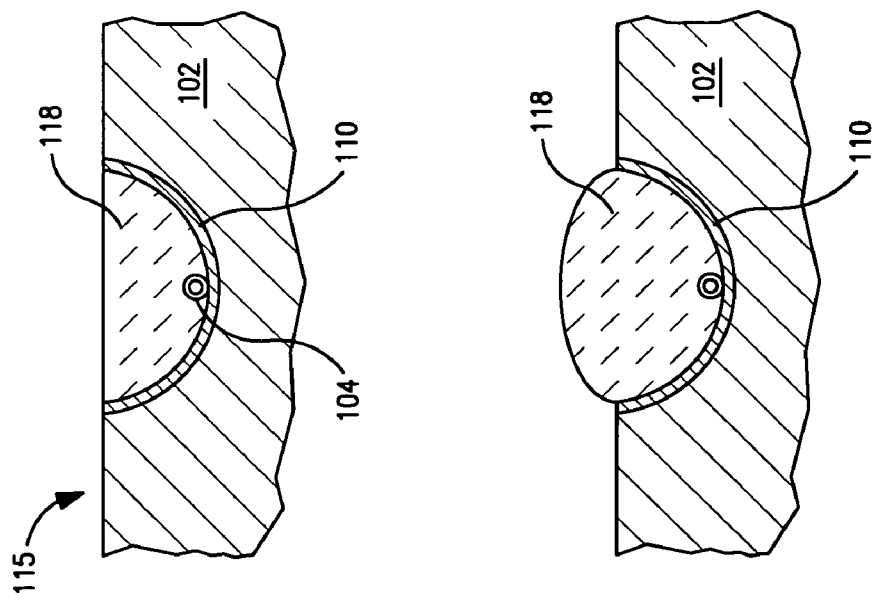
Figure 7B:
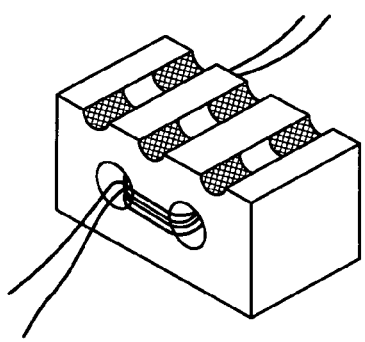
FIG. 7b is a composite illustration showing the various steps of manufacturing the exemplary device of FIG. 1.
Figure 7B:
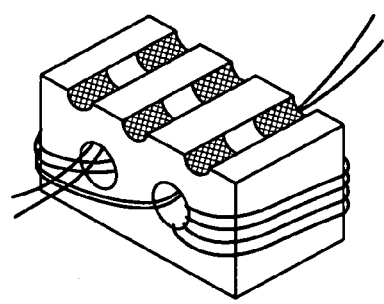
Figure 7B:
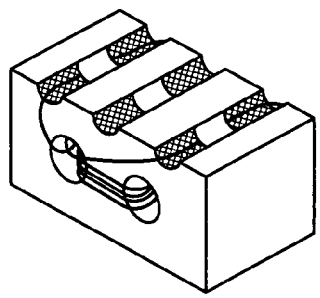
Figure 7B:
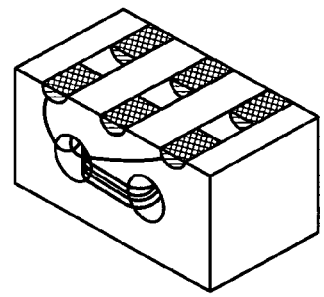

Referring now to FIGS. 7-7b, an exemplary embodiment of the method 700 for manufacturing the present invention is now described in detail.

It will be recognized that while the following description is cast in terms of the device 100 of FIG. 1, the method is generally applicable to the various other configurations and embodiments of devices disclosed herein with proper adaptation, such adaptation being within the possession of those of ordinary skill in the electrical device manufacturing field provided the present disclosure.

In a first step 702 of the method 700, one or more core elements 102 are provided. The cores may be obtained by purchasing them from an external entity or can involve fabricating the cores directly. The core component 102 of the exemplary device 100 described above is preferably formed from a magnetically permeable material (e.g., Manganese-Zinc or Nickel-Zinc mixed with other materials) using any number of well understood processes such as pressing or sintering. The core is produced to have specified material-dependent magnetic flux properties, cross-sectional shape, aperture dimensions, etc. as previously described herein.

As noted above, the core component 102 may also be cut or otherwise machined from a ferrite block, with the selected number (e.g., 3) of channels 106. Hence, a generic core blank can be used if desired and be cut down as needed.

Also included within step 702 is any required preparation of the channel surfaces in order to provide the desired environment for plating or metallization as previously described herein. For example, in one embodiment, the relevant portions of the channel surface are micro-polished in order to provide a given surface texture or roughness.

Next, in step 704, the relevant portions of the core (e.g., channels 106) are plated or metallized. This is accomplished using a standard coating and/or plating process of the type well known in the art; see discussion of an exemplary process presented above. For example, based on the materials and their properties, a conventional spray coating or electrochemical process might be used, or even a vapor deposition process. Myriad different ways of applying the coating(s) and eutectics discussed below will be appreciated by those of ordinary skill.

Next, one or more windings are provided (step 706). The windings are preferably copper-based alloy magnet wire as discussed above (see FIG. 1), although other types of conductors may be used.

Per step 708, the windings are next wound onto the core in the desired configuration (such as, e.g., that of FIG. 1 or that of FIG. 1g). The core 102 may be hand-wound, or alternatively wound on a winding machine of the type well known in the art. Note also that it is appreciated that the need for windings may, in some embodiments, not be necessary at all. In simple configurations, the core component can be adapted to have the windings plated directly on the core itself (i.e., in step 704 or another similar process/step) and therefore the plated windings would be in electrical communication with the associated terminals without the need for additional windings.

Next, per step 710, each wound core is placed on, e.g., an assembly and solder fixture of the type known in the art, and the free ends of the windings terminated to their respective metallized or plated areas on the core. This termination in the present embodiment comprises (i) routing the free ends into the channels 106 and pressing them or otherwise restraining them in position (step 712), (ii) trimming any excess lead wire within the channel (step 714), and (iii) bonding them using e.g., a water soluble or resin based solder flux along with a eutectic solder (step 716). In one variant of the method 700, the core 102 is immersed in solder up to approximately the level of the plated/metallized areas at a temperature of approximately 395 degrees C. (+/−10 C) and dwell time of 2-4 seconds, although other approaches, types of solder, and solder profiles may be used.

Even non-solder materials or techniques may be used, such as the use of an electrically conductive adhesive, or brazing or welding. Welding, for example, is a particularly attractive method when considering design attributes such as e.g., the ROHS (Pb-free) directive previously described herein.

FIG. 7a illustrates a variety of different solder (or other bonding material) profiles that may be used consistent with the invention, depending on the desired application, type of component to which the device 100 is to be mated, available processes, etc.

Lastly, per steps 718 and 720, the coils are optionally cleaned (e.g., for 2-5 minutes in either deionized water or isopropyl alcohol or another solvent) using an ultrasonic cleaning machine, and then tested if desired, thereby completing the device manufacturing process 700. FIG. 7*b* illustrates the assembly portions of the foregoing method 700 graphically.

Business-Related Methods and Apparatus

Figure 8A:
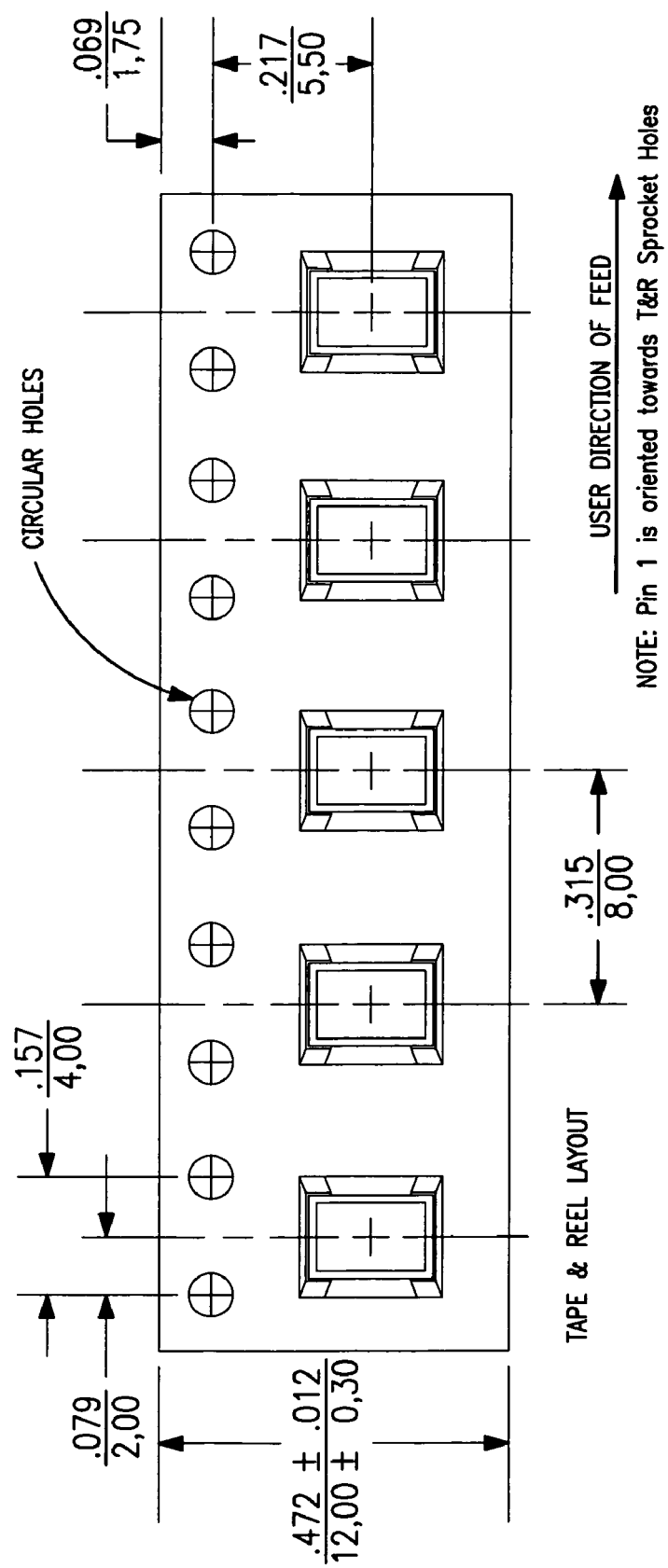
FIG. 8a is a front elevational view of an exemplary embodiment of an EIA standard carrier tape/electronic device assembly.

Referring now to FIG. 8*a*, an exemplary embodiment of an improved apparatus for lowering customer production and inventory costs according to the invention is shown. Specifically, FIG. 8*a* shows an EIA-481-compliant tape and reel carrier with the improved electronic device (such as that shown in e.g., FIGS. 1-1*g*) installed within the pockets thereof.

As previously discussed, the electronic device of the invention provides many advantages to the manufacturer of the device over prior art devices, including lower costs due to obviating the cost and labor associated with a separate termination header assembly (previously discussed with respect to FIG. 2). In addition, because a separate termination header is not needed, the device has a lower vertical profile then similar prior art devices as well as a smaller footprint due to the lack of any termination header and associated leads. However, while there are many advantages discussed for the manufacturer of the device, the present device also provides several advantages for customers (e.g., contract manufacturers) as well.

Figure 2B:
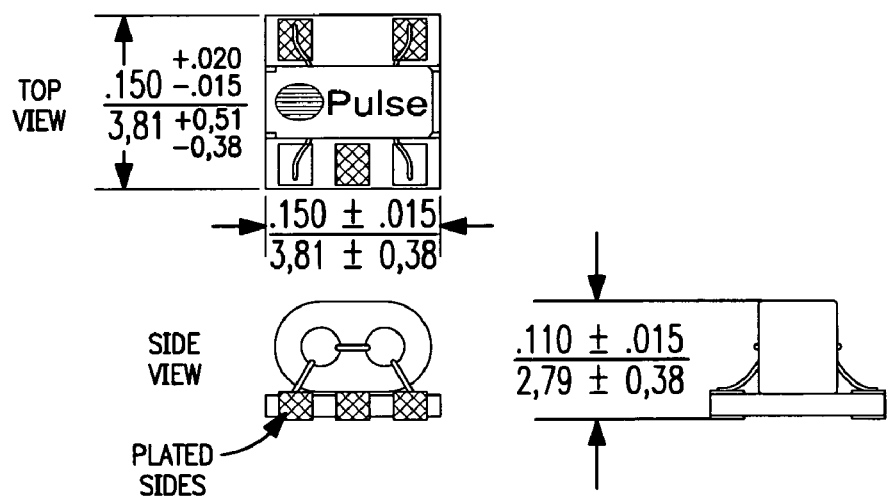
FIG. 2b is a multiple-angle elevational view of another typical prior art device.

Specifically, because of the device's small footprint and height, it can be packed in substantially higher quantities than similar performing prior art devices. As shown in FIG. 8*a*, the device packed in an industry standard 13-inch (e.g., ANSI/EIA-481-B Standard and related standards, which are incorporated herein by reference in their entirety) tape and reel carrier can house up to 3000 parts on a single reel. Prior art devices could only be packed in quantities of 2000 parts per reel or less (see e.g., the prior art device of FIG. 2*b*, showing packing at 1000 parts/reel). The resulting increase of 50% or more in the amount of parts that can be packed in the same packaging volume is substantial and provides several opportunities for end-customer and distributor cost savings. For example, in an age of rising fuel costs and the resulting increased shipping costs, the cost savings for shipping product associated with a high-volume user of the product can be substantial.

In addition, because more parts can be placed in a standard sized reel (e.g., a 13 or 22 inch reel), the customer has to change reels less frequently on his pick and place surface mounting equipment resulting in savings in production costs as well. Less frequent reel changes mean less labor is involved in otherwise automated assembly processes.

Another intrinsic advantage for customers or end-users who utilize the electronic device of the present invention is that since more parts can be packed per reel (and therefore more parts per box), less inventory space is needed in the customer's or distributor's warehouse to house product, which can in turn lead to lower overhead costs. As previously discussed, in highly competitive industries such as the electronics industry, price erosion is a reality and every manufacturer must manage its costs and overhead effectively to remain competitive. The present advantageously addresses costs at both the device manufacturer level and the board assembly level, resulting in a substantially more cost effective solution than prior art devices and approaches.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. For example, while the invention has been disclosed in terms of a component for telecommunications and networking applications, the inductive device architecture of the present invention could be used in other applications such as specialized power transformers. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A self-leaded surface-mount electronic device, comprising:
 a core element comprised of a core material and having:
  a plurality of apertures formed therein;
  a plurality of channels formed therein;
  a plurality of plated areas disposed at least proximate to said channels; and
  a plurality of windings disposed at least partly within each of said apertures and terminated to respective ones of said plated areas;
  wherein said plurality of apertures and said plurality of channels are separated by at least a portion of said core material.

2. The surface-mount electronic device of claim 1, wherein said plurality of apertures comprises two apertures, and said respective ones of said plated areas form at least a portion of the electrical pathway from said windings and an external device to which said electronic device is to be mounted.

3. The surface-mount electronic device of claim 2, wherein said plurality of channels each form a semi-circle, said semi-circle spanning less than 180-degrees of arc.

4. The surface-mount electronic device of claim 1, wherein said plurality of windings and said ferrite material are adapted to operate at frequencies in the range from about 5 MHz to about 1 GHz.

5. The surface-mount electronic device of claim 2, wherein said plurality of plated areas are formed using a silver/nickel/tin plating process.

6. The surface-mount electronic device of claim 1, wherein said plurality of channels are disposed in a substantially parallel orientation along at least a bottom face of said core element, and said plurality of apertures are disposed in a substantially parallel orientation within said core element, said channels and apertures also being substantially parallel to one another.

7. The surface-mount electronic device of claim 6, wherein said plurality of channels are each filled at least partly with a bonding material.

8. The surface-mount electronic device of claim 7, wherein said plurality of windings and said ferrite material are adapted to operate at frequencies in the range from about 5 MHz to about 1 GHz.

9. The surface-mount electronic device of claim 6, wherein said plurality of plated areas are formed using a silver/nickel/tin plating process.

10. The surface-mount electronic device of claim 6, wherein said plurality of plated areas extend substantially within said channels and are filled at least partly with a bonding material to form surfaces that are substantially flush with a bottom face of said core element.

11. A self-leaded surface-mount electronic device, comprising:
a core element having:
a plurality of apertures formed therein, each of said plurality of apertures defining a respective aperture axis;
a plurality of channels formed therein, each of said plurality of channels defining a respective channel axis;
a plurality of plated areas disposed at least proximate to said channels; and
a plurality of windings disposed at least partly within said apertures and terminated to respective ones of said plated areas;
wherein each of said respective aperture and channel axes are substantially parallel with respect to one another.

12. The surface-mount electronic device of claim 11, wherein said plurality of apertures comprises two apertures, and said respective ones of said plated areas form at least a portion of the electrical pathway from said windings and an external device to which said electronic device is to be mounted.

13. The surface-mount electronic device of claim 12, wherein said plurality of channels each form a semi-circle, said semicircle spanning less than 180-degrees of arc.

14. The surface-mount electronic device of claim 13, wherein said plurality of windings and said ferrite material are adapted to operate at frequencies in the range from about 5 MHz to about 1 GHz.

15. The surface-mount electronic device of claim 12, wherein said plurality of plated areas are formed using a silver/nickel/tin plating process.

16. The surface-mount electronic device of claim 11, wherein said plurality of channels are each filled at least partly with a bonding material.

17. The surface-mount electronic device of claim 11, wherein said plurality of plated areas extend substantially within said channels and are filled at least partly with a bonding material to form surfaces that are substantially flush with a bottom face of said core element.

18. A self-leaded surface-mount electronic device, comprising:
a core element comprising a plurality of substantially vertical faces, said core element having:
a plurality of apertures formed within the periphery of said plurality of substantially vertical faces;
a plurality of channels formed therein;
a plurality of plated areas disposed at least proximate to said channels; and
a plurality of windings disposed at least partly within said apertures and at least partly on said plurality of substantially vertical faces and terminated to respective ones of said plated areas.

19. The surface-mount electronic device of claim 18, wherein said plurality of apertures comprises two apertures, and said respective ones of said plated areas form at least a portion of the electrical pathway from said windings and an external device to which said electronic device is to be mounted.

20. The surface-mount electronic device of claim 19, wherein said plurality of channels each form a semi-circle, said semicircle spanning less than 180-degrees of arc.

21. The surface-mount electronic device of claim 20, wherein said plurality of windings and said ferrite material are adapted to operate at frequencies in the range from about 5 MHz to about 1 GHz.

22. The surface-mount electronic device of claim 21, wherein said plurality of plated areas are formed using a silver/nickel/tin plating process.

23. The surface-mount electronic device of claim 22, wherein said plurality of channels are each filled at least partly with a bonding material.

24. The surface-mount electronic device of claim 18, wherein said plurality of plated areas extend substantially within said channels and are filled at least partly with a bonding material to form surfaces that are substantially flush with a bottom face of said core element.

25. The surface-mount electronic device of claim 18, wherein said plurality of windings defines an external periphery for said self-leaded surface-mount electronic device.

26. The surface-mounted electronic device of claim 18, wherein said plurality of windings defines an external width for said self-leaded surface-mount electronic device.

27. A self-leaded surface-mount electronic device, comprising:
a core element comprising a plurality of substantially vertical faces, said core element having:
a plurality of apertures formed within the periphery of said plurality of substantially vertical faces, each of said plurality of apertures defining a respective aperture axis;
a plurality of channels formed therein, each of said plurality of channels defining a respective channel axis;
a plurality of plated areas disposed at least proximate to said channels; and
a plurality of windings disposed at least partly within said apertures and at least partly on said plurality of substantially vertical faces and terminated to respective ones of said plated areas;
wherein each of said respective aperture and channel axes are substantially parallel with respect to one another.

28. The surface-mount electronic device of claim 27, wherein said plurality of windings defines an external periphery for said self-leaded surface-mount electronic device.

29. The surface-mounted electronic device of claim 27, wherein said plurality of windings defines an external width for said self-leaded surface-mount electronic device.

30. A self-leaded surface-mount electronic device, comprising:
a binocular core element having:
a plurality of substantially parallel apertures formed therein, said apertures also being disposed such that a longitudinal axis of each is substantially parallel to the plane of a substrate to which said electronic device is to be surface-mounted;
a plurality of channels formed therein; and
a plurality of plated areas disposed at least proximate to said channels; and a plurality of windings disposed at least partly within said apertures and terminated to respective ones of said plated areas;

wherein said plurality of apertures and said plurality of channels are separated by at least a portion of said core material.

31. An area-efficient self-leaded surface-mount electronic device, comprising:
a core element having a footprint and comprised of:
a plurality of apertures formed therein;
a plurality of channels formed therein; and
a plurality of plated areas disposed at least partly within said channels; and
a plurality of windings disposed at least partly within said apertures and terminated to respective ones of said plated areas;
wherein said windings and plated areas are all substantially disposed within the footprint of said core element.

32. A self-leaded surface-mount inductive device, comprising:
a binocular inductive core element comprised of:
a plurality of apertures formed therein;
a plurality of channels formed therein; and
a plurality of plated areas disposed at least partly within said channels; and
a plurality of windings disposed at least partly within said apertures and terminated to respective ones of said plated areas;
wherein said plurality of windings and inductive core element cooperate to provide an inductive coupling between individual ones of said windings so as to effect an inductive function across said windings.

33. A self-leaded surface-mount inductive device, comprising:
a binocular inductive core element comprised of:
a plurality of apertures formed therein, said apertures formed so that a central region of said core element is disposed substantially between said apertures;
a plurality of channels formed therein; and
a plurality of plated areas disposed at least partly within said channels; and
a plurality of windings disposed at least partly within said apertures and terminated to respective ones of said plated areas;
wherein said plurality of windings are disposed such that magnetic currents induced within said core element during operation by individual ones of said windings are substantially additive in said central region.

34. A self-leaded surface-mount inductive device, comprising:
a binocular inductive core element comprised of:
a plurality of apertures formed therein, said apertures formed so that a central region of said core element is disposed substantially between said apertures;
a plurality of channels formed therein; and
a plurality of plated areas disposed at least partly within said channels; and
a plurality of windings disposed at least partly within said apertures and terminated to respective ones of said plated areas;
wherein said plurality of windings are disposed such that magnetic currents induced within said core element during operation by individual ones of said windings substantially buck one another in said central region.

35. A self-leaded surface-mount inductive device, comprising:
an inductive core element comprised of:
a plurality of apertures formed therein; and
a plurality of plated areas disposed at least partly within said channels; and
a plurality of electrically insulated windings disposed at least partly within said apertures and terminated to respective ones of said plated areas;
wherein said plurality of windings are disposed so as to induce magnetic currents within said core element.

* * * * *